United States Patent
Friedberger et al.

(10) Patent No.: US 12,160,094 B2
(45) Date of Patent: Dec. 3, 2024

(54) METHOD FOR PRODUCING A PANEL WITH INTEGRATED ELECTRONICS

(71) Applicant: Airbus (S.A.S.), Blagnac (FR)

(72) Inventors: Alois Friedberger, Oberpframmern (DE); Wolfgang Machunze, Oberhaching (DE)

(73) Assignee: Airbus (S.A.S.), Blagnac (FR)

( * ) Notice: Subject to any disclaimer, the term of this patent is extended or adjusted under 35 U.S.C. 154(b) by 235 days.

(21) Appl. No.: 17/888,068

(22) Filed: Aug. 15, 2022

(65) Prior Publication Data
US 2023/0058910 A1    Feb. 23, 2023

(30) Foreign Application Priority Data
Aug. 17, 2021  (EP) .................................... 21191738

(51) Int. Cl.
*B64C 1/06*    (2006.01)
*B64C 1/40*    (2006.01)
*H02G 3/38*    (2006.01)
*B64D 11/00*   (2006.01)

(52) U.S. Cl.
CPC ............. *H02G 3/288* (2013.01); *B64C 1/066* (2013.01); *B64C 1/406* (2013.01); *B64D 2011/0046* (2013.01)

(58) Field of Classification Search
CPC ... B32B 2605/18; B64C 1/12; H01L 23/3107; B64D 45/00; H02G 3/266; H02G 3/286; H02G 3/288; H02G 3/305; H02G 3/386; H02G 3/388; H02G 3/40
See application file for complete search history.

(56) References Cited

U.S. PATENT DOCUMENTS

| | | | |
|---|---|---|---|
| 4,168,740 A * | 9/1979 | Cairenius | F24D 3/14 165/174 |
| 4,671,038 A * | 6/1987 | Porter | E04D 3/355 52/468 |
| 5,211,784 A * | 5/1993 | Haibach | B32B 27/12 156/291 |

(Continued)

FOREIGN PATENT DOCUMENTS

DE        30 14 422 A1    11/1980
DE    10 2015 002083 A1    8/2016

(Continued)

OTHER PUBLICATIONS

European Search Report for Application No. 21191738 dated Feb. 2, 2022.

*Primary Examiner* — Kyle J. Walraed-Sullivan
(74) *Attorney, Agent, or Firm* — KDW Firm PLLC

(57) ABSTRACT

A method for producing a panel with integrated conductor tracks and electronic components. The panel includes a panel body, wherein the panel body is in particular a sandwich structure, and a membrane. The membrane is connected to the panel body and has integrated conductor tracks and electronic components. At the beginning of the method, an operation for attaching the conductor tracks and the electronic components to the membrane is provided. The subsequent step includes an operation for connecting the membrane, fitted with the conductor tracks and the electronic components, to the panel body.

13 Claims, 2 Drawing Sheets

(56) References Cited

U.S. PATENT DOCUMENTS

| | | | | |
|---|---|---|---|---|
| 5,682,943 A * | 11/1997 | Yao | ............... | B64G 1/58 |
| | | | | 165/104.21 |
| 7,349,225 B1 * | 3/2008 | Bennett | ............... | H05K 1/144 |
| | | | | 174/250 |
| 8,500,066 B2 * | 8/2013 | Lewis | ............... | B64D 45/00 |
| | | | | 343/705 |
| 8,570,152 B2 * | 10/2013 | Fahley | ............... | H02J 50/80 |
| | | | | 244/119 |
| 10,791,657 B1 * | 9/2020 | Barnes | ............... | B64C 1/406 |
| 11,485,109 B2 * | 11/2022 | Blanco Varela | ............... | B32B 5/02 |
| 2002/0036898 A1 * | 3/2002 | Miyakawa | ............... | H05K 5/068 |
| | | | | 427/96.4 |
| 2002/0102384 A1 * | 8/2002 | Peck | ............... | F28D 15/0275 |
| | | | | 428/116 |
| 2003/0207644 A1 * | 11/2003 | Green | ............... | H01J 9/02 |
| | | | | 445/24 |
| 2006/0066310 A1 * | 3/2006 | Balcom | ............... | G01R 33/3808 |
| | | | | 324/318 |
| 2006/0278972 A1 * | 12/2006 | Bauer | ............... | H01L 23/5389 |
| | | | | 257/E23.126 |
| 2007/0158501 A1 * | 7/2007 | Shearer | ............... | B64D 13/08 |
| | | | | 244/118.5 |
| 2007/0224406 A1 * | 9/2007 | Busch | ............... | B64D 13/08 |
| | | | | 428/292.1 |
| 2009/0218076 A1 * | 9/2009 | Mauduit | ............... | F28D 15/0275 |
| | | | | 29/890.032 |
| 2010/0047516 A1 * | 2/2010 | Williams | ............... | B32B 15/02 |
| | | | | 428/117 |
| 2011/0011627 A1 * | 1/2011 | Aspas Puertolas | ............... | H05K 3/103 |
| | | | | 174/251 |
| 2011/0259999 A1 * | 10/2011 | Therond | ............... | H02G 13/00 |
| | | | | 244/1 A |
| 2011/0291301 A1 * | 12/2011 | Bruendel | ............... | H01L 24/19 |
| | | | | 257/E23.141 |
| 2012/0012703 A1 * | 1/2012 | Schmid | ............... | B64D 11/00 |
| | | | | 29/447 |
| 2015/0122454 A1 * | 5/2015 | Houghton | ............... | B64G 1/506 |
| | | | | 165/47 |
| 2015/0232165 A1 * | 8/2015 | Staudigel | ............... | B64C 1/066 |
| | | | | 244/119 |
| 2016/0089851 A1 * | 3/2016 | Drexler | ............... | B44C 1/10 |
| | | | | 428/196 |
| 2016/0207636 A1 * | 7/2016 | Yokoi | ............... | B64D 45/00 |
| 2016/0214735 A1 * | 7/2016 | Garcia | ............... | G01M 5/0083 |
| 2016/0236780 A1 * | 8/2016 | Staudigel | ............... | B32B 27/304 |
| 2016/0242282 A1 * | 8/2016 | Uprety | ............... | G02F 1/155 |
| 2017/0053635 A1 * | 2/2017 | Leon | ............... | B32B 7/02 |
| 2017/0106585 A1 * | 4/2017 | Nino | ............... | B33Y 80/00 |
| 2017/0233085 A1 * | 8/2017 | Lenkey | ............... | B64D 15/16 |
| | | | | 244/134 A |
| 2017/0240300 A1 * | 8/2017 | Pierce | ............... | G10K 11/168 |
| 2017/0254065 A1 * | 9/2017 | Hegenbart | ............... | B29C 64/106 |
| 2019/0364700 A1 * | 11/2019 | Linde | ............... | H05K 9/009 |
| 2020/0070949 A1 * | 3/2020 | Porte | ............... | B64C 1/40 |
| 2020/0113054 A1 * | 4/2020 | Nino | ............... | H05K 1/16 |
| 2020/0198295 A1 * | 6/2020 | Fuentes | ............... | B32B 37/1292 |
| 2021/0309169 A1 * | 10/2021 | Kisu | ............... | B60R 16/0215 |
| 2024/0042730 A1 * | 2/2024 | Iwadate | ............... | B32B 15/20 |

FOREIGN PATENT DOCUMENTS

| | | |
|---|---|---|
| EP | 0 506 122 A2 | 9/1992 |
| EP | 3 000 593 A1 | 3/2016 |
| EP | 3 169 144 A1 | 5/2017 |

\* cited by examiner

METHOD FOR PRODUCING A PANEL WITH INTEGRATED ELECTRONICS

CROSS-REFERENCE TO RELATED APPLICATION

This application claims priority to EP 21191738.0 filed Aug. 17, 2021, the entire disclosure of which is incorporated by reference herein.

TECHNICAL FIELD

The disclosure herein relates to a method for producing a panel. In particular, the disclosure herein relates to a method for producing a panel with integrated electronics, the method making it possible to attach the electronics directly to a membrane and to subsequently connect this membrane to the panel body.

BACKGROUND

Nowadays, more or less every means of transport is equipped with electronic components for various applications. In order to supply energy to these electronic components or to use them to exchange signals, conductor tracks are required. These conductor tracks are generally in the form of a cable harness. In this case, a cable harness is an often pre-assembled bundle of individual cables which transmit signals (information) or working currents (energy). The cables are in this case guided in the form of a cable bundle and sheathed or held together by clamps, cable ties, twine or sleeves.

Furthermore, methods in which the electronics are printed are also known to those skilled in the art from the prior art. Here, printed electronics denote electronic components, assemblies and applications, such as conductor tracks, which are produced completely or partially by printing processes. Instead of inks, electronic functional materials in liquid or paste-like form are printed.

The usually limited installation space means that the electronics often run directly behind trim panels, which are intended to protect passengers against undesired interactions with the electronics.

SUMMARY

It can be considered an object of the disclosure herein to provide a method which simplifies the integration of electronic components into a panel and reduces the use of additional components.

A method for producing a panel with integrated conductor tracks and electronic components, a side wall comprising a panel according to the disclosure herein, and also an aircraft comprising a side wall according to the disclosure herein, are specified according to the features herein. Refinements of the disclosure herein emerge from the following description.

According to a first aspect of the disclosure herein, a method for producing a panel with integrated conductor tracks and electronic components is specified.

In the context of the disclosure herein, a panel constitutes an areal element which is preferably used as a trim element, in particular a board, for covering a wall or ceiling. In this case, a panel may comprise an individual board or a multiplicity of boards.

In the context of the disclosure herein, the panel comprises a panel body, wherein the panel body in particular comprises a sandwich structure. In this case, this sandwich structure is composed of multiple layers, wherein the multiple layers may be composed of different materials. The different layers fulfil various functions, for example sound or thermal insulation, improvement of the mechanical load-bearing capacity or resistance to environmental influences. The core of the sandwich structure may in this case comprise polyurethane foam or mineral wool. The combination of the layers with the shear-stiff core provides the sandwich panel with a high load-bearing capacity and a great stiffness.

Furthermore, the panel has a membrane, wherein the membrane is connected to the panel body.

In the context of the disclosure herein, a membrane is a thin structure having different properties, which as a skin or film has a great areal extent in relation to its thickness. In this case, the membrane has a protective effect for the panel body in relation to external influences. In functional terms, the membrane in the context of the disclosure herein thus constitutes a protective film.

The membrane has integrated conductor tracks and electronic components. Since the inner lining generally provides for the application of a protective film as standard, the integration of the conductor tracks and electronic components onto the membrane (protective film) makes it possible to save on additional components.

In the context of the disclosure herein, conductor tracks are electrically conducting connections having a two-dimensional profile, that is to say in a plane in which they form a conductor track plane or metallization plane. In the context of the disclosure herein, conductor tracks are used to connect electronic components to circuit boards and integrated circuits, that is to say they serve for supplying current or voltage, transmitting signals and also for dissipating heat.

In the context of the disclosure herein, conductor tracks may be inorganic or organic. In this case, possible metallic materials are, for example, copper, aluminum, gold or alloys thereof. However, conductor tracks composed of organic materials such as carbon fibers are also conceivable.

In this case, the method for producing a panel with integrated conductor tracks and electronic components has the following steps. First, the conductor tracks and the electronic components are attached to the membrane.

In the context of the disclosure herein, an attachment operation should be understood to mean any method step which produces a permanent connection between the conductor tracks and/or the electronic components and the membrane.

Subsequently, the membrane is connected to the panel body. In the context of the disclosure herein, a connecting operation should be understood to mean any method step which permits a connection between the membrane and the panel body. The connection may be reversible. The connection may be present over the entire surface of the membrane or only a part of the surface of the membrane.

According to one embodiment of the disclosure herein, the integrated conductor tracks and electronic components are attached to the inner side of the membrane, thus the side facing the panel body.

According to a further embodiment of the disclosure herein, the integrated conductor tracks and electronic components are attached to the outer side of the membrane, thus the side facing away the panel body.

According to a further embodiment of the disclosure herein, the integrated conductor tracks and electronic components are attached within the membrane. Insofar as the integrated conductor tracks and electronic components are attached within the membrane, the membrane comprises two layers, wherein the integrated conductor tracks and electronic components are arranged between these layers.

There is also the possibility of combining three or more layers with intermediate conductor tracks and/or electronic components to form a membrane. An advantage with this embodiment is that various circuits can be arranged one above the other, without having a negative influence on one another. In this case, the layers may be composed of the same material, the layers may also be composed of different materials. There is also the possibility of attaching conductor tracks and/or electronic components on an outer side, and on an inner side, and, in the case of two or more layers, also between the layers.

According to a further embodiment of the disclosure herein, the step of attaching the conductor tracks and electronic components comprises an additive process.

Examples of additive manufacturing processes are bulk printing processes such as intaglio printing, offset printing and flexographic printing, which compared with other printing processes are distinguished in particular by a far superior productivity which permits a surface-area throughput of several tens of thousands of $m^2$/h. A prerequisite for an additive manufacturing process is, in addition to the respective electronic functionality, that the materials are in liquid form, that is to say in the form of a solution, dispersion or suspension. Analogously to conventional illustration printing in which multiple color layers are applied one above the other, electronic thin-film components such as the conductor tracks and electronic components according to the disclosure herein are produced by printing multiple functional layers one above the other. Further additive manufacturing processes are, for example, inkjet printing, screen printing or nanoimprint lithography.

According to a further embodiment of the disclosure herein, the step of attaching the conductor tracks and electronic components comprises a subtractive process. Examples of subtractive processes are in this case the application of etching masks or the lift-off process.

The two types of process, additive processes and subtractive processes, can be combined with one another.

According to a further embodiment of the disclosure herein, the membrane comprises a thermoplastic polymer. Thermoplastic polymers are plastics which can be deformed in a certain temperature range. This operation is reversible, that is to say that the operation can be repeated as often as desired by cooling and reheating to the molten state as long as the onset of what is known as thermal decomposition of the material is not caused due to overheating.

In this case, the thermoplastic of the membrane in particular comprises polyvinyl fluoride. Polyvinyl fluoride is dirt-repellent and readily cleanable, and is therefore particularly suitable for use as a protective film.

According to a further embodiment of the disclosure herein, the step of connecting the membrane to the panel body comprises the provision of an adhesion layer.

In this case, the adhesion layer can comprise any process material which is able to form a surface adhesion between the membrane and the panel body.

According to a further embodiment of the disclosure herein, the adhesion layer is integrated into the membrane.

In this case, the adhesion layer may completely cover that surface of the membrane which is intended to make contact with the panel body, or alternatively may have cutouts along the conductor tracks and/or electronic components.

According to a further embodiment of the disclosure herein, the panel body has, on the side facing the membrane, a layer composed of glass-fiber-reinforced plastic impregnated with phenol resin.

According to a further embodiment of the disclosure herein, a first conductor track and a second conductor track are connected to one another by way of a bridging device. In this case, the bridging device has a spacing from the membrane, and forms a gap as a result. As a result, below the bridging device, a third conductor track can be arranged through the gap produced, wherein the third conductor track is not in contact with the first and second conductor tracks.

By way of the bridging device, it is also possible to implement a single-layer approach in addition to a multi-layer approach with a respective insulating layer. The bridging device serves in this case as a bridge over a conductor track which is not intended to make contact, and as a result permits a very thin design with a high weight saving, wherein in particular crossings can be implemented without a short circuit.

According to a further embodiment of the disclosure herein, the electronic component comprises a sensor, selected from the group temperature sensor, smoke detector, gas sensor, contact sensor and proximity sensor. However, other sensors are also conceivable.

Since sensors generally require only very low currents, small cross sections of the conductor tracks are also possible. For applications involving higher currents, greater cross sections, such as by the application of copper by lamination, can also be utilized. Insofar as the sensor is a contact sensor, the contact sensor may also be part of a touchpad.

According to a further embodiment of the disclosure herein, the electronic component comprises a light-emitting diode or an acoustic emitter. The light-emitting diode may be configured to illuminate a region, or to display a visual signal in the dark or in poor lighting conditions. The acoustic emitter may be configured to transmit an acoustic signal to a user, or to serve as a loudspeaker.

According to a further embodiment of the disclosure herein, the conductor tracks and the electronic components preferably have a maximum thickness of 20 μm, particularly preferably a maximum thickness of 15 μm.

According to a further embodiment of the disclosure herein, the membrane is a decorative film.

In this case, the decorative film is scratch-resistant and resistant to mechanical influences. Furthermore, the decorative film is impermeable to fats and oils and diffusion-resistant in relation to gases.

According to a further aspect of the disclosure herein, a side wall of an interior space of an aircraft, comprising a panel produced by a method according to the disclosure herein, in particular a floor panel, a ceiling panel, a side panel or a baggage compartment panel, is specified. In this case, the side walls can be inserted in the passenger region, in the cockpit or in the cargo region. However, other regions are also conceivable.

According to a further aspect of the disclosure herein, an aircraft comprising a side wall according to the disclosure herein is specified. In this case, the aircraft may be a passenger aircraft, a cargo aircraft, a helicopter or a drone.

BRIEF DESCRIPTION OF THE DRAWINGS

Example embodiments of the disclosure herein will be described below with reference to the figures. In the figures.

DETAILED DESCRIPTION

Figure 1:
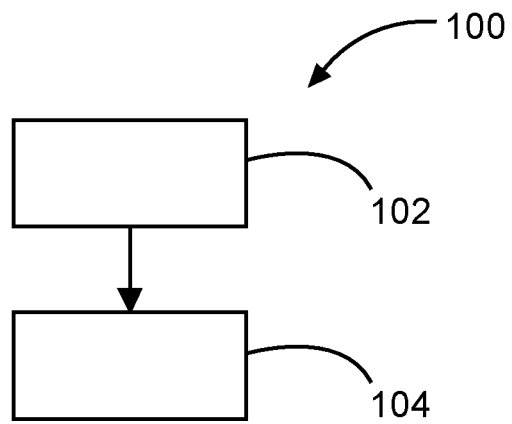
FIG. 1 shows a flow diagram of the method according to one example embodiment of the disclosure herein.

The illustrations in the figures are schematic and not true to scale.

If the same reference numerals are used in the following description of the figures, these reference numerals refer to identical or similar elements.

FIG. 1 shows a flow diagram of the method 100 according to one example embodiment of the disclosure herein. The method 100 is used to produce a panel 10 with integrated conductor tracks 18 and electronic components 16, wherein the panel 10 and its individual components are shown in more detail in FIG. 2 and are described in the description of FIG. 2. The panel 10 in this case comprises a panel body 12, wherein the panel body 12 in particular comprises a sandwich structure. Furthermore, the panel 10 comprises a membrane 14. In this case, the membrane 14 is connected to the panel body 12 and has integrated conductor tracks 18 and electronic components 16.

The method 100 is divided into the following steps. At the beginning of the method, an operation for attaching 102 the conductor tracks 18 and the electronic components 16 to the membrane 14 is provided. The subsequent step comprises an operation for connecting 104 the membrane 14, fitted with the conductor tracks 18 and the electronic components 16, to the panel body 12.

Figure 2:
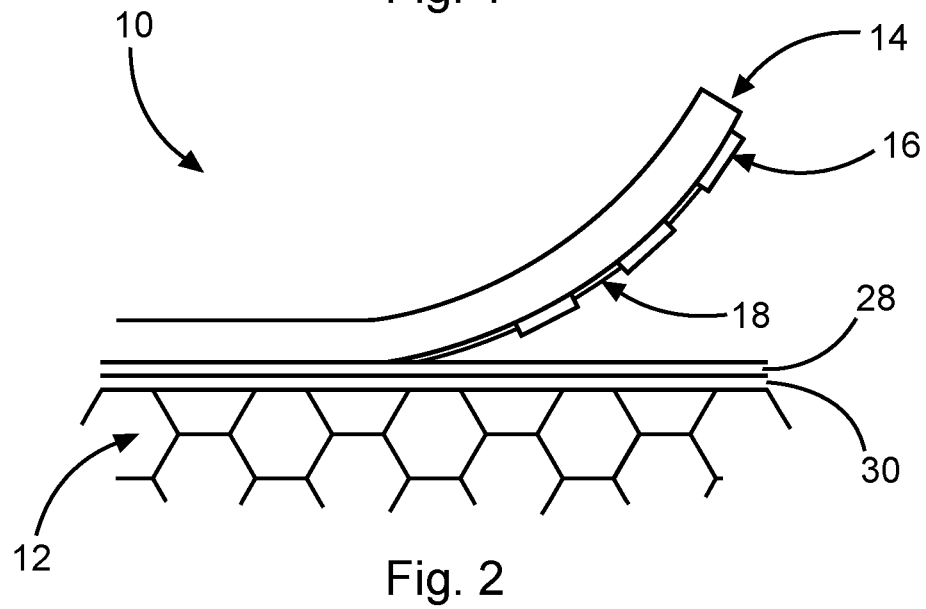
FIG. 2 shows a panel according to a further example embodiment of the disclosure herein, the membrane having not yet been completely connected to the panel body.

FIG. 2 shows a detailed construction of a panel 10 according to the disclosure herein. The panel 10 has a panel body 12 which, in the present embodiment, is produced from a sandwich structure. Provided on the panel body 12 is a layer 30 impregnated with phenol resin and composed of glass-fiber-reinforced plastic. In order to connect the membrane 14 to the panel body, an adhesion layer 28 is also provided. In the example embodiment shown, conductor tracks 18 and electronic components 16 are attached to the membrane on the side facing the panel body 12. In FIG. 2, for better clarity, the conductor tracks 18 and electronic components are shown merely on that part of the membrane 14 which is spaced apart from the panel body 12, however, those skilled in the art will recognize that the conductor tracks 18 and electronic components 16 are also present in the region in which the membrane 14 is connected to the panel body 12.

Figure 3:
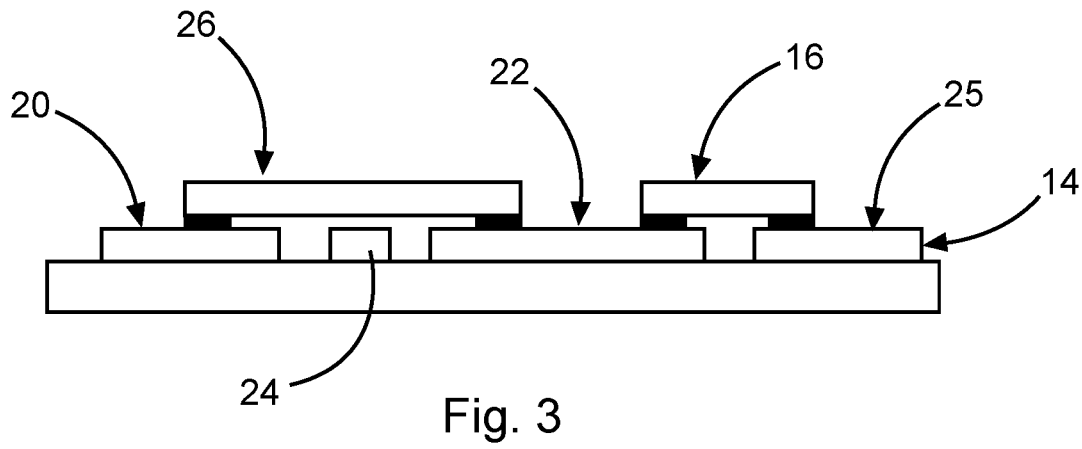
FIG. 3 shows a membrane with integrated conductor tracks, an electronic component and a bridging device, according to a further example embodiment of the disclosure herein.

FIG. 3 shows a membrane 14 with integrated conductor tracks 18, an electronic component 16 and a bridging device 26, according to a further example embodiment of the disclosure herein. A first conductor track 20 and a second conductor track 22 are shown here, the first conductor track 20 being connected to the second conductor track 22 by way of a bridging device 26. In this case, the bridging device 26 has a spacing from the membrane 14, and thus forms a gap. A third conductor track 24 is arranged below the bridging device 26, wherein the third conductor track runs through the gap produced and is not in contact with the first conductor track 20 and the second conductor track 22.

Furthermore, an electronic component 16 is shown. In this case, the electronic component 16 is connected to the third conductor track 24 and a fourth conductor track 25. It should be understood that a detail of a multiplicity of possibilities for attaching the electronics to the membrane are shown in FIG. 3 only by way of example, and further combinations are conceivable.

Figure 4:
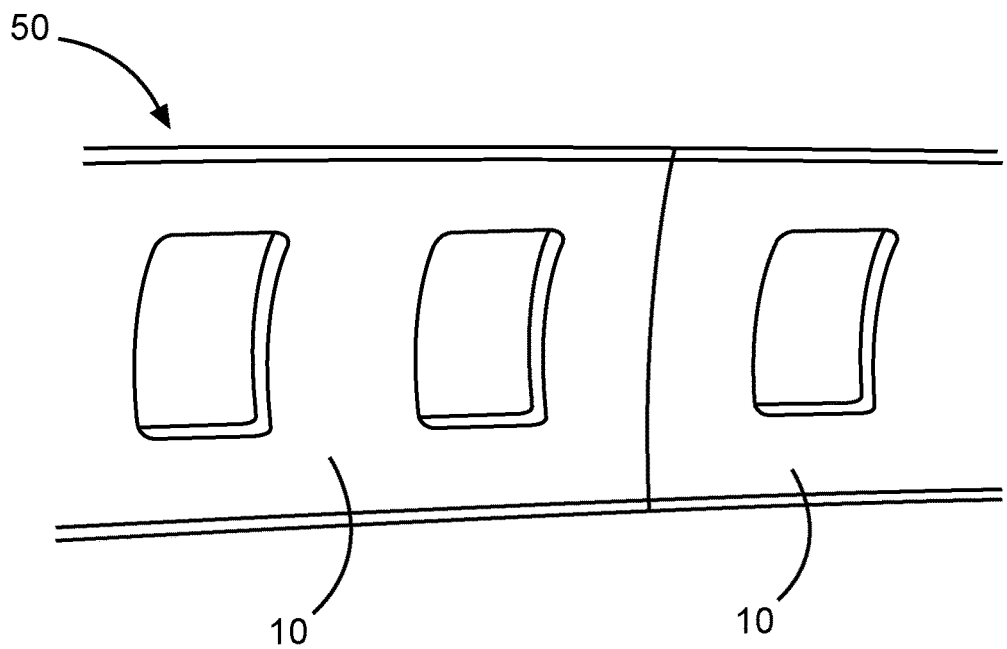
FIG. 4 shows a side wall of an interior space of an aircraft, according to a further example embodiment of the disclosure herein.

FIG. 4 shows a side wall 50 of an aircraft, according to a further example embodiment of the disclosure herein. In the present example embodiment, the side wall is covered with a side panel having cutouts for windows, wherein the side panel is a panel 10 produced by the method 100 according to the disclosure herein. Two panels 10 are shown by way of example, wherein the panels can be attached over the complete length of the interior space of the aircraft (not shown).

Figure 5:
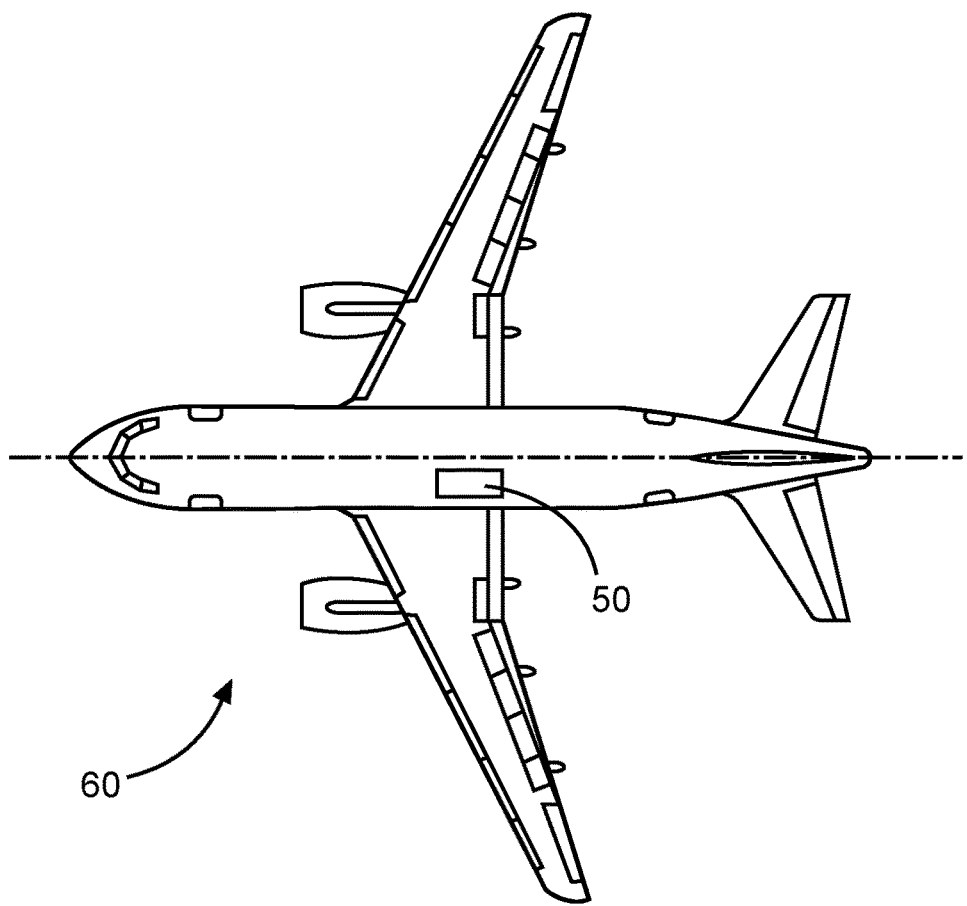
FIG. 5 shows an aircraft comprising a side wall according to a further example embodiment of the disclosure herein.

FIG. 5 shows an aircraft 60 comprising a side wall 50 according to a further example embodiment of the disclosure herein. In this case, the side wall 50 is arranged, by way of example, in the fuselage region of the aircraft 60, however it is conceivable for the side wall 50 to be arranged in the cockpit or in the tail region without limitations. In this case, the side panel may also be a floor panel, a ceiling panel or a baggage compartment panel.

While at least one example embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the example embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF THE REFERENCE SIGNS

10 Panel
12 Panel body
14 Membrane
16 Electronic component
18 Conductor track
20 First conductor track
22 Second conductor track
24 Third conductor track
25 Fourth conductor track
26 Bridging device
28 Adhesion layer
30 Layer composed of glass-fiber-reinforced plastic impregnated with phenol resin
50 Side wall
60 Aircraft

The invention claimed is:

1. A method for producing a panel with integrated conductor tracks and electronic components, the panel comprising:

a panel body that comprises a sandwich structure;

a membrane connected to the panel body, the membrane comprising conductor tracks and electronic components integrated into the membrane;

the method comprising:

attaching the conductor tracks and the electronic components to the membrane; and following attachment of the conductor tracks and the electronic components, connecting the membrane to the panel body;

wherein the conductor tracks and the electronic components are attached to a side of the membrane facing the panel body; and wherein connecting the membrane to the panel body comprises providing an adhesion layer on the membrane, wherein the adhesion layer forms a surface adhesion between the membrane and the panel body, and wherein the adhesion layer comprises cutouts along one or more of the conductor tracks or the electronic components.

2. The method of claim 1, wherein attaching the conductor tracks and electronic components comprises an additive process.

3. The method of claim 1, wherein attaching the conductor tracks and electronic components comprises a subtractive process.

4. The method of claim 1, wherein the membrane comprises a thermoplastic polymer, or a thermoplastic polymer comprising polyvinyl fluoride.

5. The method of claim 1, wherein the adhesion layer is integrated into the membrane.

6. The method of claim 1, wherein the panel body has, on a side facing the membrane, a layer comprising glass-fiber-reinforced plastic impregnated with phenol resin.

7. The method of claim 1, wherein a first conductor track and a second conductor track can be connected by a bridging device, wherein the bridging device has a spacing from the membrane, and forms a gap as a result, such that, below the bridging device, a third conductor track can be arranged through the gap produced, without making contact with the first conductor track and second conductor track.

8. The method of one claim 1, wherein the electronic component comprises a sensor selected from the group consisting of a temperature sensor, smoke detector, gas sensor, contact sensor and proximity sensor.

9. The method of claim 1, wherein the electronic component is a light-emitting diode or an acoustic emitter.

10. The method of claim 1, wherein the conductor tracks and the electronic components have a maximum thickness of 20 µm, or have a maximum thickness of 15 µm.

11. The method of claim 1, wherein the membrane is a scratch-resistant decorative film.

12. A side wall of an interior space of an aircraft, comprising a panel produced by the method of claim 1, wherein the panel is a floor panel, a ceiling panel, a side panel or a baggage compartment panel.

13. An aircraft comprising a side wall of claim 12.

* * * * *